(12) United States Patent
Huang et al.

(10) Patent No.: US 11,244,943 B2
(45) Date of Patent: Feb. 8, 2022

(54) THREE-DIMENSIONAL INTEGRATED CIRCUITS (3DICS) INCLUDING BOTTOM GATE MOS TRANSISTORS WITH MONOCRYSTALLINE CHANNEL MATERIAL

(71) Applicant: Intel Corporation, Santa Clara, CA (US)

(72) Inventors: Cheng-Ying Huang, Hillsboro, OR (US); Gilbert Dewey, Hillsboro, OR (US); Ashish Agrawal, Hillsboro, OR (US); Kimin Jun, Portland, OR (US); Willy Rachmady, Beaverton, OR (US); Zachary Geiger, Hillsboro, OR (US); Cory Bomberger, Portland, OR (US); Ryan Keech, Portland, OR (US); Koustav Ganguly, Hillsboro, OR (US); Anand Murthy, Portland, OR (US); Jack Kavalieros, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/728,983

(22) Filed: Dec. 27, 2019

(65) Prior Publication Data
US 2021/0202476 A1    Jul. 1, 2021

(51) Int. Cl.
*H01L 27/06* (2006.01)
*H01L 21/683* (2006.01)
(Continued)

(52) U.S. Cl.
CPC ...... *H01L 27/0688* (2013.01); *H01L 21/6835* (2013.01); *H01L 21/823807* (2013.01);
(Continued)

(58) Field of Classification Search
CPC ......... H01L 27/0688; H01L 21/823871; H01L 29/045; H01L 27/092; H01L 21/6835;
(Continued)

(56) References Cited

U.S. PATENT DOCUMENTS 9,368,512 B1    6/2016  Cheng et al.
9,685,436 B2 *  6/2017  Morrow ............ H01L 21/76895
(Continued)

*Primary Examiner* — Shahed Ahmed
*Assistant Examiner* — Vicki B. Booker
(74) *Attorney, Agent, or Firm* — Essential Patents Group, LLP

(57) ABSTRACT

A monolithic three-dimensional integrated circuit may include multiple transistor levels separated by one or more levels of metallization. An upper level transistor structure may include a monocrystalline channel material over a bottom gate stack. The channel material and the gate stack materials may be formed on a donor substrate at any suitable temperature, and subsequently transferred from the donor substrate to a host substrate that includes lower-level circuitry. The upper-level transistor may be patterned from the transferred layers so that the gate electrode includes one or more bonding layers. Source and drain material may be patterned from a source and drain material layer that was transferred from the donor substrate along with the channel material, or source and drain material may be grown at low temperatures from the transferred channel material.

21 Claims, 10 Drawing Sheets

(51) Int. Cl.
  *H01L 21/8238* (2006.01)
  *H01L 29/10* (2006.01)
  *H01L 29/04* (2006.01)
  *H01L 29/08* (2006.01)
  *H01L 27/092* (2006.01)

(52) U.S. Cl.
  CPC ........ *H01L 21/823814* (2013.01); *H01L 21/823857* (2013.01); *H01L 21/823871* (2013.01); *H01L 27/092* (2013.01); *H01L 29/045* (2013.01); *H01L 29/0847* (2013.01); *H01L 29/1033* (2013.01); *H01L 2221/68363* (2013.01)

(58) Field of Classification Search
  CPC ......... H01L 21/823857; H01L 29/1033; H01L 29/0847; H01L 21/823814; H01L 21/823807; H01L 2221/68363
  See application file for complete search history.

(56) References Cited

U.S. PATENT DOCUMENTS

| | | |
|---|---|---|
| 2004/0007724 A1 | 1/2004 | Murthy et al. |
| 2013/0270512 A1 | 10/2013 | Radosavljevic et al. |
| 2018/0090582 A1 | 3/2018 | Adusumilli et al. |
| 2018/0331232 A1 | 11/2018 | Frougier et al. |
| 2019/0035889 A1 | 1/2019 | Mohapatra et al. |
| 2020/0126987 A1 | 4/2020 | Rubin et al. |

* cited by examiner

THREE-DIMENSIONAL INTEGRATED CIRCUITS (3DICS) INCLUDING BOTTOM GATE MOS TRANSISTORS WITH MONOCRYSTALLINE CHANNEL MATERIAL

BACKGROUND

Demand for integrated circuits (ICs) in portable electronic applications has motivated greater levels of semiconductor device integration. A 3-dimensional (3D) Is may be assembled from multiple monolithic die, or a 3DIC may be monolithically fabricated. Relative to assembly-based techniques, monolithic 3DIC fabrication holds the promise of denser architectures. One difficulty however is the relatively low temperature (e.g., below 450° C.) processing needed to ensure monolithic fabrication of a subsequent device level does not degrade the performance of a previously fabricated device level.

Given the limitation of process temperature, amorphous Si (a-Si), poly-Si, and amorphous oxide semiconductor (AOS) have been explored as alternative back end thin film transistor (TFT) channel materials because these materials can be deposited at low temperature by sputtering, chemical vapor deposition (CVD), or atomic layer deposition (ALD) processes. Bottom gated transistor architectures employing such materials are widely used in display industry, for example. However, amorphous or polycrystalline semiconductor materials usually have lower carrier mobility and higher variability than devices employing a monocrystalline channel material. Amorphous oxide semiconductors have instability concerns that may lead to degraded performance and/or yield limitations.

Another challenge of upper-level transistors is device leakage. Many applications, such as a memory cell access transistor, demand low off-state (e.g., source-to-drain) leakage. It may therefore be beneficial for an upper-level transistor to employ a high-k gate dielectric. Some high-k gate materials however rely on one or more thermal anneals to achieve stable interfaces, which may not be possible within the low temperature threshold of upper-level device fabrication. Without the ability to perform a suitable anneal, high-k gate dielectric reliability may suffer, and/or upper-level devices may be relegated to using lower-k gate dielectric materials (e.g., $SiO_2$, $Si_3N_4$, etc.).

Low temperature techniques for forming monocrystalline semiconductor channel materials over a robust gate stack that are suitable for monolithic 3DIC integration would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
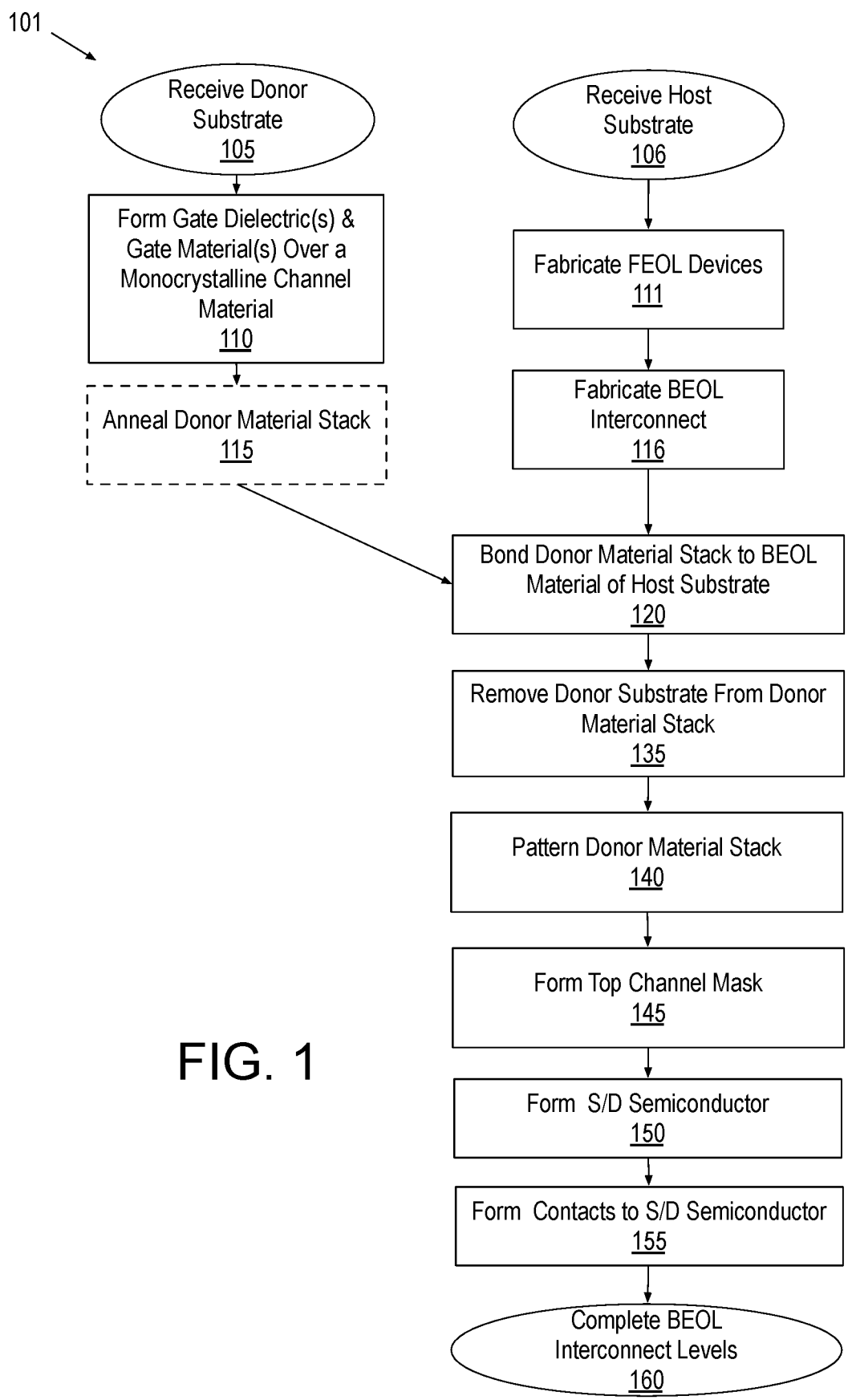
FIG. 1 is a flow diagram illustrating methods of fabricating upper-level transistor structures over lower-level integrated circuitry, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that some embodiments may be practiced without these specific details. In some instances, well-known methods and devices are shown in block diagram form, rather than in detail, to avoid obscuring other aspects of an embodiment. Reference throughout this specification to "an embodiment" or "one embodiment" means that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments herein, upper-level, or "back-end-of-line" (BEOL) field effect transistor (FET) structures have a "bottom-gate" architecture and include a monocrystalline (single crystal) channel semiconductor material over the gate stack. A layer of such monocrystalline channel material may be referred to herein as a "thin film." As such, an upper-level transistor in accordance with embodiments herein may be referred to as a thin film transistor, or "TFT," for example to distinguish it from a FEOL transistor that employs semiconductor material of a starting substrate.

In accordance with embodiments herein, upper-level transistors are referred to herein as being "monolithic" with lower-level transistors to distinguish a monolithic 3DIC from a composite 3DIC that instead includes a first preformed die having a prefabricated first (e.g., lower-level) transistor and/or integrated circuit that is joined to a second preformed die also having a prefabricated second (e.g., upper-level) transistor and/or integrated circuit. In a monolithic 3DIC, a second (e.g., upper-level) transistor and/or integrated circuit is fabricated directly upon a first (e.g., lower-level) transistor and/or integrated circuit. Because such direct fabrication of the upper-level transistor and/or integrated circuit will permit finer alignment between the upper-level and the lower-level transistors and/or integrated circuits, a monolithic 3DIC may achieve higher IC density than a composite 3DIC.

Notably, the formation of a monolithic 3DIC through direct fabrication of an upper-level transistor and/or integrated circuit according to embodiments herein does not preclude the joining of preforms as an alternative to a blanket film deposition process, which can result in advantageous material stacks. For example, an unpatterned material film may be transferred from a donor substrate to a host substrate (e.g., at the wafer level). From there, direct fabrication may proceed with a subsequent patterning of the transferred film(s) (e.g., while on the host substrate). In contrast to the density limitation that may be imposed by joining one fully patterned preform to another fully patterned preform, unpatterned film transfers pose no limitation to the density of a monolithic 3DIC.

As described further below, in addition to having the benefit of a monocrystalline channel material over a bottom gate stack, an upper-level FET may also benefit from the gate stack further including either (or both) a metal gate electrode and a gate dielectric having a high bulk relative permittivity (i.e., high-k). Because such a gate stack can be challenging to form directly over lower-level circuitry (e.g., needing one or more high temperature processes), the gate stack and a channel material layer may instead be first formed upon a donor substrate, and subsequently transferred from the donor substrate to a host substrate that further includes lower-level circuitry. The gate electrode may incorporate one or more metal layers that are further utilized to bond the gate stack to the host substrate. Following material layer transfer, the channel material layer and gate stack material layers may be patterned to define the upper-level transistor structure with a high-fidelity patterning process that can be accurately aligned to features of the lower-level circuitry.

In accordance with some further embodiments described herein, low-temperature (e.g., <450° C.) processes are employed to epitaxially grow an in-situ doped source and drain material from a seeding surface of monocrystalline channel material. The concentration of electrically active dopants within such epitaxial source and drain material may be much higher than within the channel material. Through the introduction of impurity-doped source or drain material, impurities within the channel material may minimized. As such, the upper-level transistors structures described herein may have significantly higher channel mobility than a transistor structure that otherwise includes more impurity dopants throughout the channel material, for example for the sake of achieving lower source and drain contact resistance to channel material without forming distinct source and drain material. Because the epitaxial source/drain growth is performed as part of a monolithic fabrication process, source/drain material may have very fine pitches (e.g., 40-125 nm) on transistors having channel regions precisely aligned to lower-level circuitry.

Alternatively, a source and drain material layer may be preformed on a donor substrate, along with the channel material and gate stack. The source and drain material layer may then be transferred from the donor substrate to a host substrate along with the channel material layer and gate stack. Following transfer, the source and drain material layer may be patterned with a high-fidelity patterning process that can be accurately aligned to the upper-level transistor structure and/or features of the lower-level circuitry. Because such patterning is performed as part of a monolithic fabrication process, source/drain material may again have very fine pitches (e.g., 40-125 nm) on transistors having channel regions precisely aligned to lower-level circuitry.

Any of the embodiments introduced above may be practiced for either NMOS or PMOS upper-level transistor structures. For example, a bottom gate stack may include a work function layer that is tuned to set a threshold voltage suitable for either a PMOS or an NMOS device. In some embodiments, the work function layer is a mid-gap material, which may be suitable for upper-level devices that can have an ultra thin body as a result of the minimal thickness of the transferred channel material.

In some further embodiments, upper-level circuitry is complementary metal-oxide-semiconductor (CMOS) where a subset of upper-level transistors are NMOS and a subset of upper-level transistors are PMOS. For some such embodiments, one or more of the techniques to fabricate a transistor structure of one conductivity type may be substantially duplicated to fabricate a transistor structure of the complementary conductivity type. In other such embodiments, different techniques are employed to fabricate transistor structures of complementary conductivity. For example, two different techniques for forming source and drain material may be combined, with layer transfer employed for one of the NMOS or PMOS upper-level transistors, and epitaxial growth employed for the other of the NMOS or PMOS upper-level transistors. In some exemplary embodiments, n-type source and drain material, which can be challenging to form at low temperatures, may be advantageously formed at high temperatures on a donor substrate. Following transfer to the host substrate, NMOS source and drain regions may be patterned from the transferred n-type source and drain material layer. For an upper-level PMOS transistor, p-type source and drain material may be epitaxially grown at low temperature from regions of the channel material which have been exposed, for example during patterning of the transferred n-type source and drain material layer. For some further CMOS embodiments, a bottom gate stack transferred to the host substrate may include a mid-gap gate work function layer.

FIG. 1 is a flow diagram illustrating fabrication methods 101 suitable for forming upper-level bottom-gate transistors that include a monocrystalline channel material, in accordance with some exemplary embodiments. FIG. 2A-2I are cross sectional views showing an upper-level bottom-gate transistor structure evolving, in accordance with some embodiments of methods 101.

Referring first to FIG. 1, methods 101 begin at block 105 where a donor substrate is received. The donor substrate may advantageously include a monocrystalline channel semiconductor layer, such as a silicon layer. The channel material layer may be a device layer of a semiconductor on insulator (SOI) wafer, or the channel material layer may be a portion of a bulk monocrystalline substrate, for example. In the example further illustrated in FIG. 2A, a monocrystalline channel material layer 205 is over a donor substrate 201, which is illustrated in dashed line to emphasize the layer structure of donor substrate 201 can vary widely. For example, in an SOI embodiment, donor substrate 201 includes a dielectric material (not separately depicted) that is in contact with channel material layer 205. For a bulk embodiment, donor substrate 201 includes additional thickness of monocrystalline semiconductor.

Channel material layer 205 may have any composition that is suitable for a channel region of a PMOS and/or NMOS transistor, and is therefore referred to herein as "channel material." In some exemplary embodiments, channel material layer 205 is a Group IV elemental or alloy semiconductor material, such as substantially pure Si, substantially pure Ge, or a SiGe alloy (which may be either predominantly Si or predominantly Ge). In some other embodiments, channel material layer 205 is a Group III-V alloy semiconductor material, such as, but not limited to, GaAs, InAs, InGaAs, InAlAs, AlAs, InGaAlAs, AlGaAs, InP, InSb, InGaSb, GaSb, InGaP, etc. In still other embodiments, channel material layer 205 is a Group III-N alloy semiconductor material, such as, but not limited to, GaN, InGaN, AlGaN, InAlGaN, or AlN. Although only one channel material layer 205 is illustrated, two or more such layers of differing composition may be included as part of a channel material layer stack.

Monocrystalline channel material layer 205 may have any crystal orientation. In some cubic/zinc blende lattice embodiments, channel material layer 205 has (100) orientation where a top surface is a <100> plane. In some alternative embodiments where channel material layer 205 has a hexagonal lattice, a c-axis of the crystal is aligned with the z-axis depicted in FIG. 2A.

Channel material layer 205 may have any level of impurity doping and have any conductivity type. In some exemplary embodiments, channel material layer 205 is intrinsic, having no deliberately introduced impurities.

Methods 101 continue at block 110 where a gate stack is formed over the channel material layer. One or more gate dielectric layers may be formed over the channel material layer with one gate dielectric layer formed directly upon, (or grown from) a surface of the monocrystalline channel material layer. In some embodiments, gate dielectric material is deposited by CVD or ALD. Formation of the gate stack may further include deposition of one or more gate electrode material layers over the gate dielectric layer(s). Depending on composition, gate electrode material(s) may be sputter deposited (PVD), and/or deposited by CVD or ALD. In some embodiments, a work function layer is deposited directly on a surface of a gate dielectric material.

Figure 2A:
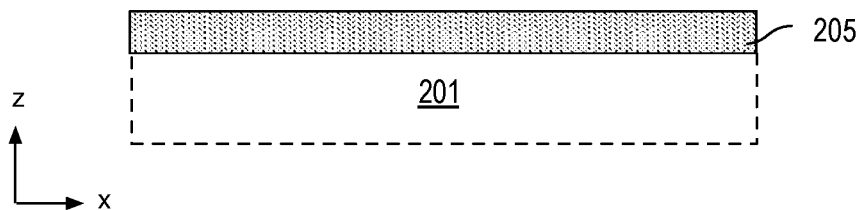
FIGS. 2A, 2B, 2C, 2D, 2E, 2F, 2G, 2H, and 2I are cross sectional views showing an upper-level transistor structure evolving to include a monocrystalline channel material over a gate stack, in accordance with some embodiments.
Figure 2B:
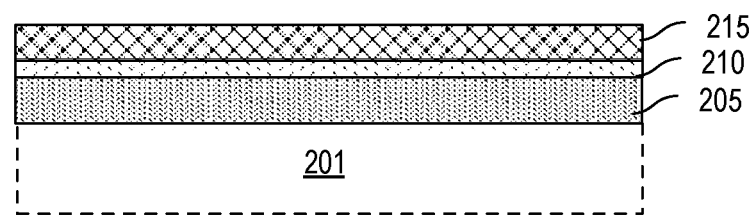

In the example further illustrated in FIG. 2B, a gate dielectric 210 has been deposited directly on a surface of channel material layer 205. In some embodiments, gate dielectric 210 is a high-k material having a bulk relative permittivity over 7 (e.g., 8, or more). A high-k gate material may have any composition known to be suitable as a gate dielectric, such as, but not limited to, metal oxides or metal silicates. In some examples, gate dielectric 210 comprises oxygen and at least one of Hf (e.g., $HfO_2$), Al (e.g., $Al_2O_3$), Zr (e.g., $ZrO_2$), Y (e.g., $Y_2O_3$), Ta (e.g., $Ta_2O_5$), or Ti (e.g., $TiO_2$). Silicates, such as, but not limited to $HfSiO_x$, or $TaSiO_x$ may also be suitable. In some alternative embodiments, gate dielectric 210 includes a lower-k material, for example having a bulk relative permittivity of 7, or less. Lower-k gate material may have any composition known to be suitable as a gate dielectric, such as, but not limited to, silicon dioxide, silicon nitride, or silicon oxynitride. Hence, in some embodiments where the channel material layer is a Group IV material (e.g., Si), gate dielectric 210 may be either a high-k metal oxide or lower-k native oxide. Gate dielectric 210 may have any physical thickness and equivalent oxide electrical thickness (EOT).

As further illustrated in FIG. 2B, the gate electrode portion of a gate stack includes a work function layer 215. In some embodiments, work function layer 215 comprises a material having a workfunction difference from the channel material that achieves a desired threshold voltage in a PMOS transistor. In some other embodiments, work function layer 215 comprises a material having a workfunction difference from the channel material that achieves a desired threshold voltage in an NMOS transistor. In some other embodiments, work function layer 215 comprises a mid-gap material having a workfunction difference from the channel material that achieves a threshold voltage suitable for both an NMOS transistor and a PMOS transistor. In some examples work function layer 215 comprises a metal, and may be a metallic compound such a metal nitride (e.g., TiN or TaN). Work function layer 215 may also comprise Al (e.g., TiAlN). Other alloy constituents may also be employed in metallic work function layer embodiments, such as, but not limited to C, Ta, W, Pt, and Sn. In alternative embodiments, work function layer 215 comprises a semiconductor doped to a desired conductivity type, such as but not limited to, polycrystalline silicon (n-type or p-type), polycrystalline SiGe, or polycrystalline Ge. Hence, in some embodiments where the channel material is a Group IV material (e.g., Si), and gate dielectric 210 is a high-k metal oxide, work function layer 215 may comprise a metal. In other embodiments where the channel material is a Group IV material (e.g., Si), and gate dielectric 210 is a lower-k silicon oxide, work function layer 215 may comprise a metal or polycrystalline silicon.

In further embodiments, the gate electrode portion of a gate stack also includes one or more additional material layers, such as one or more metal (metallic) layer. Such a metal layer may function to reduce the bulk resistivity of a gate electrode stack, and may further function as a bonding layer that will facilitate the subsequent bonding of the gate stack to a host substrate. In the example further illustrated in FIG. 2C, a bonding layer 220 is deposited on work function layer 215. Bonding layer 220 may advantageously be a metal, such as, but not limited to, one or more of Ti, Ni, W, Ru, Cu, Al, or Pt. Bonding layer 220 may be a metallic compound, such as, but not limited to, TiN or TaN. With a gate stack formed over a monocrystalline channel material, the entire gated channel material stack 230 may be further processed to achieve desired gate-channel chemical composition profile and/or material interface stability.

Returning to FIG. 1, methods 101 may continue at block 115 where the material stack that was formed over the donor substrate is thermally annealed. Block 115 is in dashed line to emphasize the thermal anneal is optional and may be skipped, for example where an anneal is of little benefit to a particular gated channel material stack. For example, where channel material is silicon and the gate dielectric is silicon dioxide, an anneal at block 115 may be unnecessary. If block 115 is performed, the anneal may be at any temperature, for any duration, and in any environment suitable for the gate stack and channel material that was formed over the donor substrate. Since the donor substrate need not place any constraints on the anneal process, high temperatures may be employed at block 115. In some exemplary embodiments, the anneal performed at block 115 is at a temperature over 600° C., and may be 800° C., or higher (e.g., 1000° C.). As described further below, one or more other processes requiring high temperatures may be further performed on the donor substrate. For example, a semiconductor material layer may be epitaxially grown and/or a dopant implantation and activation anneal may be performed to form a monocrystalline source and drain material layer in addition to the monocrystalline channel material layer.

Referring still to FIG. 1, methods 101 further include receiving a host substrate at block 106. The host substrate may be any substrate upon which front-end-of-line (FEOL) FETs may be fabricated at block 111. In some embodiments, the FEOL FETs include both n-type and p-type FETs interconnected into a CMOS FEOL circuit. Alternatively, the host substrate received at block 106 includes FEOL FETs that have already been fabricated, for example upstream of methods 101. The FEOL FETs may have any architecture and be fabricated according to any technique(s). At block 116, the FEOL FETs may be interconnected with one or more metallization levels to form FEOL circuitry. The host substrate received at block 106 might also include FEOL FETs that were previously interconnected into FEOL circuitry, for example upstream of methods 101. In still other embodiments, the substrate received at block 106 may include one or more back-end-of-line (BEOL) transistor layers over which an additional BEOL transistor layer may be formed according to methods 101.

Methods 101 continue at block 120 where the top most material of the gate stack formed on the donor substrate is bonded to a top most material of the host substrate. The gate stack fabricated on the donor wafer may therefore include a layer that is advantageous for facilitating the transfer of the monocrystalline channel material. Similarly the top most material of the host substrate may be advantageous for facilitating the transfer of the monocrystalline channel material. Any direct material bonding process may be employed at block 120. For example, a thermo-compression bonding process may bond a gate electrode layer (e.g., a metallic bonding layer) to a BEOL material layer, such as another bonding layer or interconnect metallization layer. Since the gate electrode layer and/or bonding layer on the donor substrate is unpatterned, it may be advantageous for the bond to be made to another unpatterned bonding layer of the host substrate.

Figure 2C:
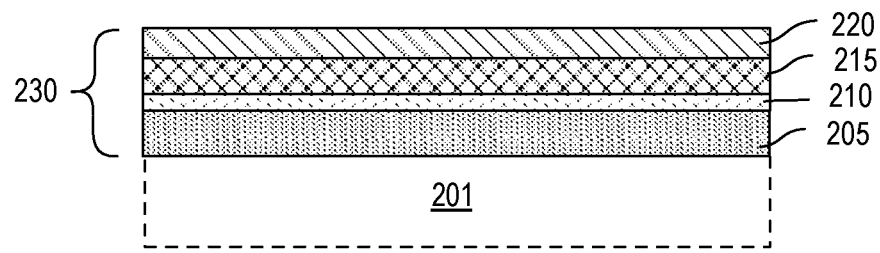
Figure 2D:
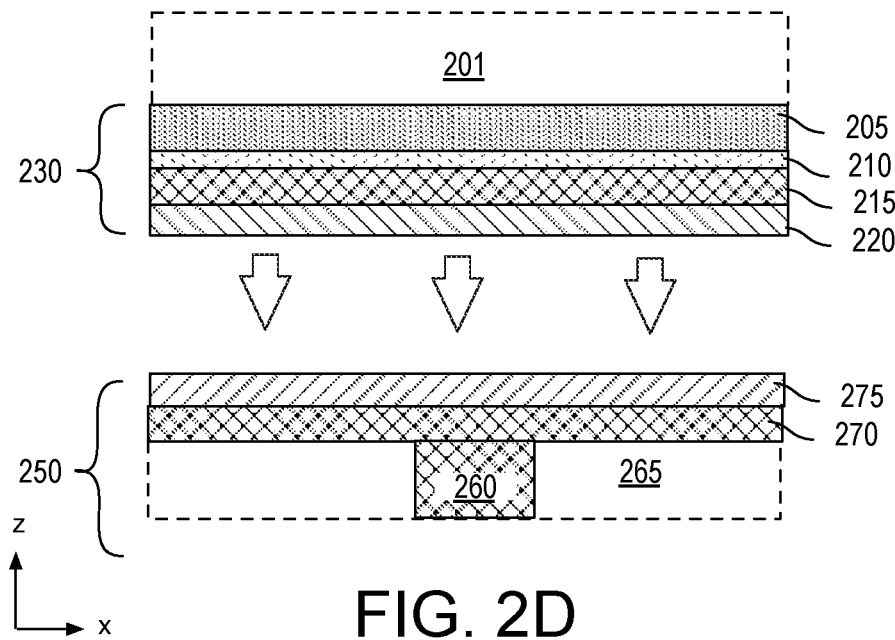

In the example further illustrated in FIG. 2D, a host substrate 250 includes any number of BEOL interconnect metallization levels (e.g., 1-20), with only the top most level represented by dashed line for clarity. Below the interconnect metallization levels, host substrate 250 further includes lower-level transistors (not depicted). As shown, an unpatterned metal layer 270 is over a patterned interconnect metallization feature 260. Patterned interconnect metallization feature 260 may be a conductive via or line embedded in a dielectric material 265 and further interconnected to lower metallization levels (not depicted). Interconnect metallization feature 260 may be, for example, an alloy of predominantly Ru or Cu, an alloy of predominantly W, or an alloy of predominantly Al, etc. Dielectric material 265 may be predominantly silicon and oxygen (e.g., $SiO_x$), or predominantly silicon and nitrogen (e.g., $SiN_x$). In other examples, dielectric material 123 is a low-k dielectric having a relative permittivity below 3.9 (e.g., carbon-doped silicon oxide, SiOC:H).

Metal layer 270 may have any composition and thickness. In some embodiments, metal layer 270 has the same composition as metallization feature 260 (e.g., Ru or Cu). In other embodiments, metal layer 270 comprises a compound suitable as a diffusion barrier (e.g., TaN, TiN), or an adhesion layer (e.g., Ti). In the illustrated example, host substrate 250 further includes a bonding layer 275 over metal layer 270. Bonding layer 275 may have substantially the same composition as bonding layer 220 (FIG. 2C). For example, bonding layer 275 (FIG. 2D) may be a metal, such as, but not limited to, one or more of Ti, Ni, W, Ru, Cu, Al, Pt, TiN or TaN. The composition of bonding layer 275 may also be different than that of bonding layer 220, such as any metal having the advantage of being able to form a metal-metal bond with a metal bonding layer 220. Bonding layer 275 may also be chemically reactive with bonding layer 220. In some embodiments, bonding layer 275 comprises silicon and forms a silicide (e.g., $NiSi_x$, $TiSi_x$, $WSi_x$, $PtSi_x$) with bonding layer 220. Equivalently, bonding layer 220 may instead comprise silicon and form a silicide with a metal of bonding layer 220.

As shown in FIG. 2D, donor substrate 201 is inverted and aligned with host substrate 250 to bring bonding layer 220 into contact with bonding layer 275. As material layers on donor substrate 201 are unpatterned, the alignment merely needs to be wafer-level and does not require nanometer precision. Any pressure and/or thermal processing may be performed to form a permanent bond (e.g., metal-to-metal) between the bonding layers. In exemplary embodiments, the thermal processing does not exceed 450° C. to avoid detrimentally impacting BEOL interconnect levels and/or lower-level transistor level(s) of host substrate 250.

Returning to FIG. 1, methods 101 continue at block 135 where the donor substrate is removed from the donor material stack, transferring the donor material stack to the host substrate. The material layer transfer may be perfected according to any layer transfer techniques known. For example, a hydrogen implant may be performed on the donor substrate (e.g., following block 115) to define a cleave plane within the substrate semiconductor (e.g., Si). Such an implant may be through the gate stack, for example. At block 135, the donor substrate may then be cleaved off from the channel semiconductor material along the predefined cleave plane. Alternatively, substrate 201 may be ground and polished down from the backside (unbonded side) at block 135 to expose the monocrystalline channel material layer on the host substrate. Such a technique may avoid any potential for implant damage to the channel semiconductor and/or gate stack. In some embodiments, for example where the donor substrate is an SOI substrate, a stop layer within the donor substrate may be leveraged to define an interface of the material stack that is to be transferred.

Figure 2E:
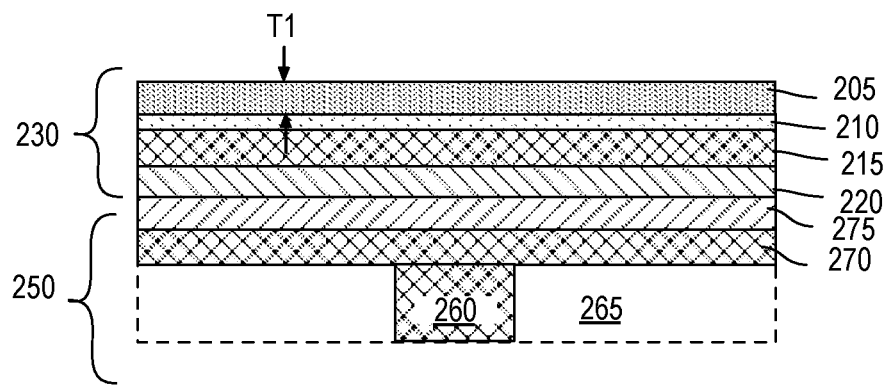

In the example further illustrated in FIG. 2E, gated channel material stack 230 has been separated from donor substrate 201 so that channel material layer 205 is now the top most material layer over host substrate 250. The gate stack, including gate dielectric 210 and work function layer 215 is in the "bottom-gate" position, between channel material layer 205 and host substrate 250. Bonding layers 220 and 275 are in direct contact with each other, perfecting the bond within the composite stack. Optionally, the exposed surface of channel material layer 205 may be polished after layer transfer to achieve a desired channel thickness T1 and/or surface smoothness. Although channel thickness T1 may vary widely, channel thickness T1 may be small enough that the upper-level transistor fabricated will have an ultra thin body architecture akin to transistor structures employing a device layer of an SOI substrate. In some embodiments, for example, channel thickness T1 is no more than 50 nm, advantageously below 30 nm, and may be as little as 10 nm.

Returning to FIG. 1, methods 101 continue at block 140 where the at least the donor material stack (i.e., the transferred material layers) is patterned to define a portion of the upper-level transistor structure. Any subtractive patterning process may be performed at block 140. In some examples, an etch mask may be defined with one or more photolithographic imaging processes, and one or more etch processes may be performed to remove the layers of the donor material stack not protected by the etch mask. Noting the donor material stack includes semiconductor, gate dielectric, and gate electrode material layer(s), an etch process may include multiple steps, chemistries or even multiple techniques to pattern the various material layers.

Figure 2F:
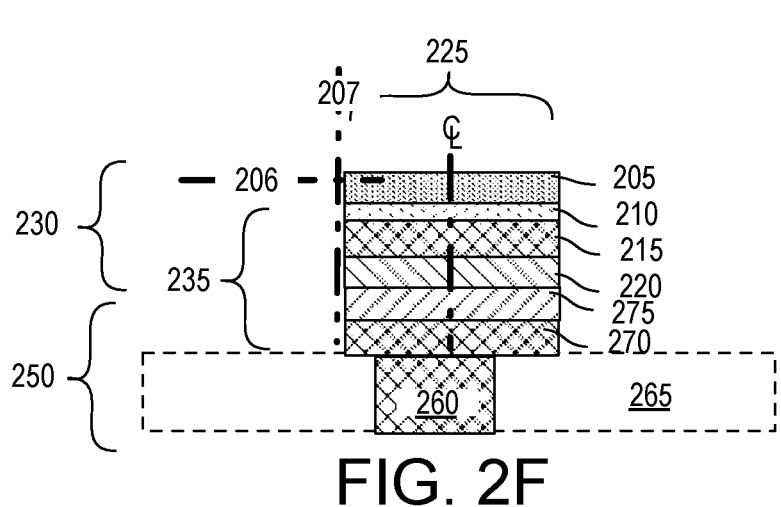
Figure 2G:
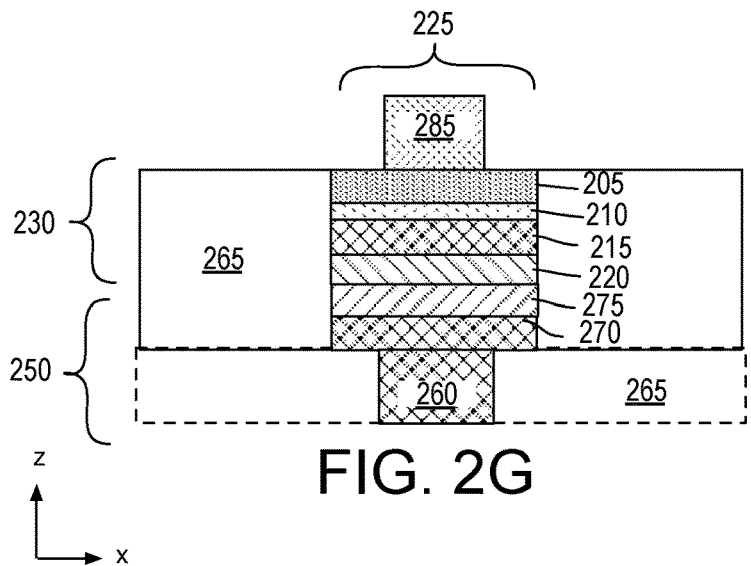
Figure 2H:
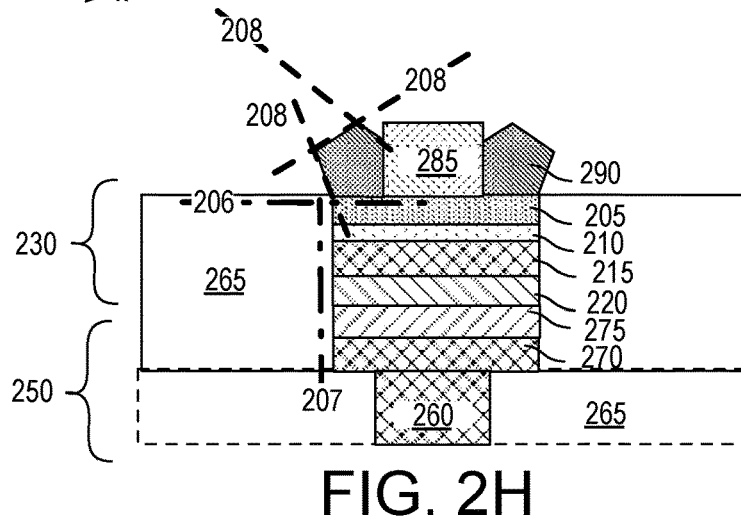
Figure 2I:
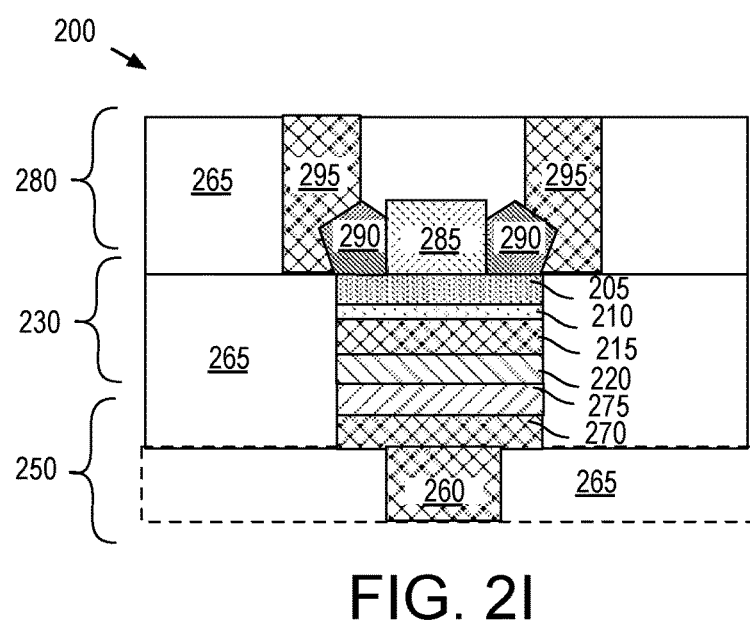

In the example further illustrated in FIG. 2F, an active device structure 225 has been defined with a patterning process. Active device structure 225 includes a channel material layer 205 that has a sidewall defining a perimeter of active device structure 225. Active device structure 225 further includes a patterned gate stack 235 that includes both transferred donor material layers as well as bonding material layer 275 and metal layer 270 that were directly deposited on host substrate 250 prior to the layer transfer. In the illustrated example, gate stack 235 is in substantial alignment with channel material layer 205, with the various material layers all sharing a centerline, which is indicative of them all having been patterned according to a same mask level. In contrast, some larger amount of misalignment or registration error may be evident between active device structure 225 and interconnect metallization feature 260. Interconnect metallization feature 260 may not share the centerline of active device structure 225 in one or more dimensions, which is indicative of device structure 225 having been patterned from a different mask level than interconnect metallization feature 260. Although the various material layers of active device structure 225 may have differing sidewall slopes and/or overhang or undercut relative to channel material layer 205, in the example illustrated the sidewall of each of gate dielectric 210, work function layer 215, bond layers 220, 275 and metal layer 270 are in alignment with the sidewall of channel material layer 205. Device structure 225 therefore has a composite sidewall 207 that is substantially vertical, or orthogonal to channel material plane 206.

Returning to FIG. 1, methods continue with forming a top channel mask at block 145. The top channel mask facilitates the definition of separate portions of the channel material layer where source and drain regions are to be. In the example further illustrated in FIG. 2G, one or more additional dielectric material 265 has been deposited over active device structure 225, and planarized. Top channel mask 285 has been formed over active device structure 225, for example bifurcating a top surface of channel material layer 205 into two discontinuous portions. Top channel mask 285 may be patterned at another mask level, separate from that used to define active device structure 225, for example. Top channel mask 285 may be a permanent "dummy gate" structure that maintains electrical isolation between source and drain regions. For such embodiments, top channel mask 285 may be any suitable dielectric material. Alternatively, top channel mask 285 may be a sacrificial feature that is ultimately not retained in the final transistor structure. For such embodiments, top channel mask 285 may be any material that can be removed with adequate selectively relative to channel material layer 205.

Returning to FIG. 1, methods 101 continue at block 150 where source and drain material is formed. In the example further illustrated in FIG. 2H, source and drain material 290 is epitaxially grown from exposed surfaces of channel material layer 205. In exemplary embodiments, the source and drain epitaxial growth is performed at a temperature that does not exceed 450° C. Epitaxial growth of source and drain material may be made selective, for example with more material forming upon a monocrystalline seeding surface than is formed over an amorphous or polycrystalline (non-seed) material. In the example illustrated in FIG. 2H, source and drain material 290 is selectively grown on a top surface of channel material layer 205 that is not masked by top channel mask 285. In alternative embodiments, unmasked portions of channel material layer 205 may be first recess etched, and source and drain material 290 then grown within separate recesses and/or from separate sidewall surfaces of channel material layer 205. As shown, source and drain material 290 may grow as separate crystals with one or more sidewall facets 208 that are non-orthogonal and non-parallel to channel material plane 206 and/or non-parallel and non-orthogonal to device structure sidewall 207. For example, sidewall facets 208 may be along <111> planes (45 deg.) where channel material plane 206 defines a (100) plane and source and drain material 290 has a cubic lattice. Such faceting of source and drain material 290 is indicative of source and drain material 290 having been formed by an additive process subsequent to the transfer of channel material layer 205, rather than having been patterned through a subtractive process, for example during patterning of channel material layer 205.

In accordance with some embodiments, source and drain material 290 also comprises predominantly monocrystalline n-type semiconductor material. For example, where channel material layer 205 is monocrystalline silicon, source and drain material 290 may comprise predominantly silicon and one or more n-type impurities/dopants. Although silicon-based heavily doped semiconductor material is usually formed at temperatures over 800° C., low temperature n-type silicon growth is possible and the interested reader is referred to U.S. patent application Ser. No. 16/728,903, titled "Three-dimensional Integrated Circuits (3DICs) Including Upper-Level MOS Transistors With Epitaxial Source & Drain Material," which is commonly assigned.

In some other embodiments, for example where channel material layer 205 is a Group III-V material, source and drain material 290 may comprise the same Group III and Group V majority constituents as the channel material layer (e.g., InGaAs, GaAs, InAs), along with additional n-type impurity dopant. In alternative embodiments, the majority lattice constituents of source and drain material 290 may differ from those of channel material layer 205. For example, the majority lattice constituents may be selected to reduce the activation energy of the impurity dopant introduced in-situ, or for otherwise achieving a lower source/drain material resistance (e.g., through a reduced bandgap). Hence, in some embodiments where channel material layer 205 comprises a first Group III-V or Group III-N alloy, source and drain material 290 comprises a second Group III-V alloy or Group III-N alloy, respectively.

In accordance with some alternative embodiments, source and drain material 290 comprises predominantly monocrystalline p-type semiconductor material. In some examples where channel material layer 205 is monocrystalline silicon, source and drain material is monocrystalline p-type doped Si, Ge, SiGe, or GeSn. Notably, Ge and GeSn alloys have an advantageously low energy of bond formation and a p-type impurity, such as B or Ga, may be introduced as the in-situ dopant to render the deposited material p+ doped. Many low-temperature Ge-based growth processes are known. In some alternative embodiments where channel material layer 205 is monocrystalline III-V semiconductor, source and drain materials may also be a p-type Group III-V alloy. Depending on the majority constituent(s) of the source/drain material, various impurity dopants are possible, such as Be for GaSb.

Returning to FIG. 1, methods 101 continue at block 155 with the formation of contact metal to the source and drain material. At block 155, any number of dielectric materials may be deposited over the upper-level transistor structure, and planarized. Any suitable contact or via etch may then be performed to expose the source and drain material. Contact metal may then be deposited by PVD, CVD, or ALD, for example. The contact metal may also be deposited by electrolytic or electroless plating. In some exemplary embodiments, at least one of Ti, Cu, Ta, Co, Ni, Pt, Pd, or Al is deposited directly on the source and/or drain material. Any of these metals, an alloy including two or more of these metals, or a compound further including nitrogen (e.g., TiN or TaN) may form a thermally stable, low-resistance contact to either n-type or p-type source and drain material. In the example further illustrated in FIG. 2I, contact metal 295 extends through at least some of dielectric materials 265 with at least a sidewall of individual features of contact metal 295 landing on, or intersecting, a corresponding source and drain material 290. A three terminal upper level transistor structure 200 is then substantially complete and ready for interconnection into circuitry.

Methods 101 (FIG. 1) complete at block 160 where monolithic fabrication may continue with the formation of any number of additional back end interconnect metallization levels to arrive at the final monolithic 3DIC structure. For example, terminals of upper-level transistor structure 200 may be coupled into BEOL circuitry. In some further embodiments, BEOL circuitry is electrically interconnected to FEOL circuitry through one or more interconnect metallization levels.

Methods 101 may be practiced with various modifications to fabricate other transistor structures, which may be similarly incorporated into a monolithic 3DIC. For example, instead of an exclusively bottom-gate architecture, an upper-level transistor may further include a back gate for a four terminal architecture, or further include a top-gate in a double gate architecture. Nanowire, or gate-all-around architectures are also possible, as are other non-planar (fin) architectures.

Figure 3A:
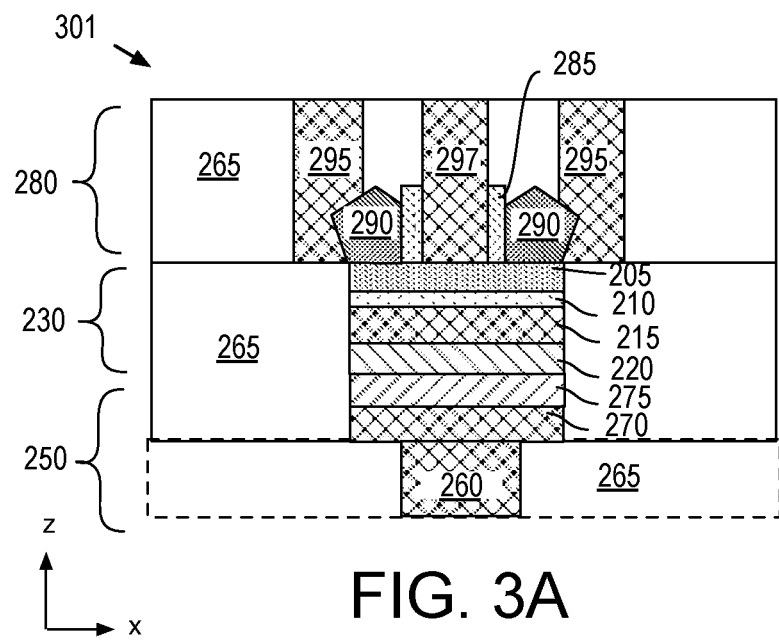
FIGS. 3A and 3B are cross sectional views showing upper-level transistor structures including a monocrystalline channel material over a gate stack, in accordance with some alternative embodiments.

FIG. 3A is cross sectional view of an upper-level transistor structure 301 including channel material layer 205 over a bottom gate stack, and a back gate 297 over channel material layer 205, in accordance with some alternative embodiments. Upper-level transistor structure 301 may be fabricated according to methods 101 (FIG. 1) and all reference numbers in FIG. 3A previously introduced may share any of the attributes previously described. As shown, transistor structure 301 includes gated channel material stack 230 that may have been transferred from a donor substrate to host substrate 250, for example substantially as described above. In transistor structure 301 however, source and drain material 290 is separated, in part, by back gate 297. To fabricate back gate 297, methods 101 may further include a partial replacement of top channel mask 285 (e.g., patterning of a recess in top channel mask 285 exposing channel material, and backfilling of the recess with back gate 297). In this example, back gate 297 forms a metal-semiconductor (Schottky) junction with a top surface of channel material layer 205, opposite the bottom gate stack. Back gate 297 may comprise the same metal as source and drain contact metal 295, or it may have a different composition.

Figure 3B:
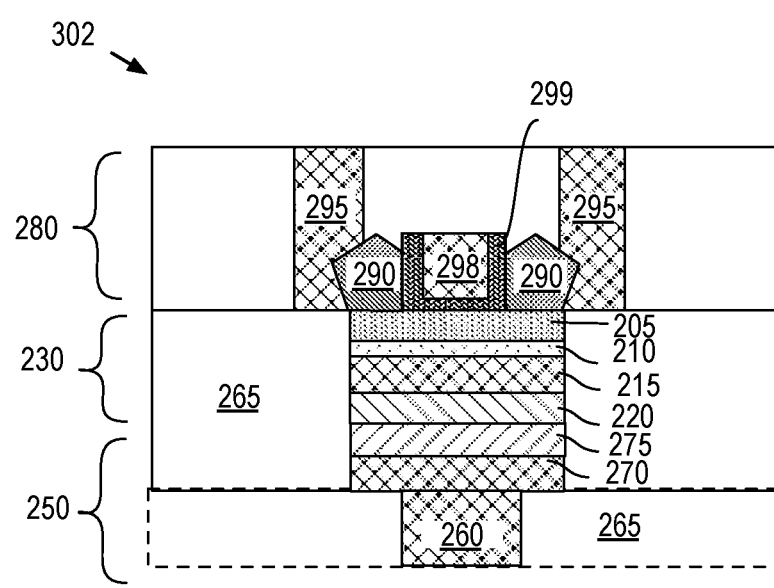

FIG. 3B is cross sectional view showing an upper-level transistor structure 302 including channel material layer 205 over a bottom gate stack, and a top gate 298 over channel material layer 205, in accordance with some alternative embodiments. Upper-level transistor structure 302 may be fabricated according to methods 101 (FIG. 1), and all reference numbers in FIG. 3B previously introduced may share any of the attributes previously described. As shown, transistor structure 302 includes gated channel material stack 230 that may have been transferred from a donor substrate to host substrate 250, for example substantially as described above. In transistor structure 302 however, source and drain material 290 is separated by intervening top gate 298. Top gate 298 may be fabricated as the top channel mask (block 145) in methods 101 (FIG. 1). Alternatively, top gate 298 may be formed according to a gate replacement process where the top channel mask formed in methods 101 is replaced before or after the formation of the source and drain. Such a replacement process may include, for example, a selective etch of channel mask 285, deposition of a top gate dielectric 299 over the top surface of channel material layer 205, and deposition gate electrode 298 over top gate dielectric 299. Noting the top gate stack is formed after gated channel material stack 230 has been transferred from a donor substrate to host substrate 250, top gate stack formation may be limited to processing temperatures below 450° C. As such, a high temperature anneal of the top gate may not be possible. Therefore, double gate embodiments may advantageously employ a bottom gate stack that does not rely on a high temperature anneal so that the materials of the top gate stack may match those of the bottom gate stack.

Notably, the material layers included in a donor material stack that are transferred to a host substrate may vary. Methods 101 (FIG. 1) may therefore vary as a function of the material layers included in the donor material stack. For example, in some embodiments the donor material stack includes a source and drain material layer in addition to a channel material layer. For such embodiments, the source and drain material layer and the channel material layer are both advantageously monocrystalline. With no restrictions on donor substrate processing temperatures, conventional techniques employing high temperatures may be employed to form a source and drain material layer on the donor substrate. For example, source and drain dopants may be introduced into source and drain semiconductor material through ion implantation followed by thermally driven activation. Alternatively, dopants may be introduced during a high temperature (e.g., 800° C.) epitaxial growth of a source and drain material layer.

FIG. 4A-4G cross sectional views depicting upper-level transistor structures evolving to include a monocrystalline channel material over a gate stack, in accordance with some further embodiments where a donor material stack included source and drain material. As is clear from the similarities with the transistor structures depicted in FIG. 2A-2I, the structures illustrated in FIG. 4A-4G may also be generated by practicing methods 101 (FIG. 1).

Figure 4A:
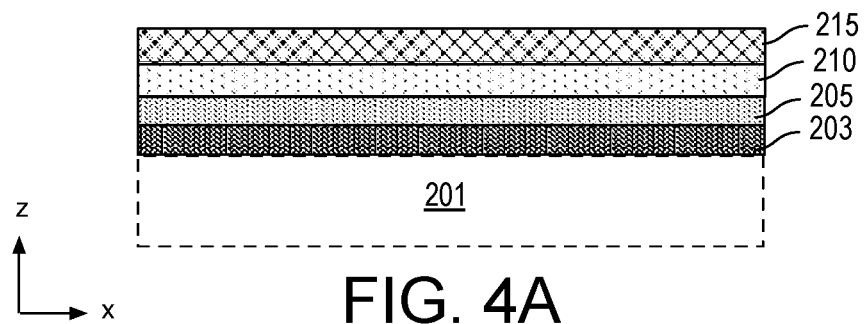
FIGS. 4A, 4B, 4C, 4D, 4E, and 4F are cross sectional views showing an upper-level transistor structure evolving to include a monocrystalline channel material over a gate stack, in accordance with some embodiments.

Referring first FIG. 4A, channel material layer 205 is over donor substrate 201 with a source and drain material layer 203 between channel material layer 205 and donor substrate 201. In the illustrated embodiment, source and drain material layer 203 is in contact with channel material layer 205. Channel material layer 205 is again monocrystalline, as is source and drain material layer 203. Source and drain material layer 203 may have any of the material compositions described above for source and drain material 290. Source and drain material layer 203 may have any of the crystal properties described above for channel material layer 205. For example, source and drain material layer 203 and channel material layer 205 may both be cubic with a (100) orientation. Source and drain material layer 203 may have the same majority lattice constituent(s) as channel material layer 205. For example, both source and drain material layer 203 and channel material layer 205 may be predominantly silicon with source and drain material layer 203 including higher levels of impurity dopant, which may be either n-type (e.g., phosphorus) or p-type (e.g., boron). Alternatively, source and drain material layer 203 may have different majority lattice constituent(s) than channel material layer 205. For example, channel material layer 205 may be predominantly silicon while source and drain material layer 203 is predominantly Ge, SiGe alloy or a GeSn alloy that further includes significant levels of n p-type impurity dopant(s). In other examples where channel material layer 205 is a first III-V(N) alloy, source and drain material layer 203 may be the same or a different III-V(N) alloy.

Source and drain material layer 203 may be formed over donor substrate 201 according to a variety of techniques. For example, a technique suitable for forming a doped well may be employed to form source and drain material layer 203. In some embodiments, impurity dopants are implanted into monocrystalline material at a depth below channel material layer 205. An activation anneal may then be performed. Alternatively, an epitaxial growth process may be employed to first grow source and drain material layer 203 with in-situ impurity doping from a seed layer of donor substrate 201. Another epitaxial growth process (e.g., undoped) may be further employed to grow channel material layer 205 over source and drain material layer 203. Depending on whether the channel material layer and/or source and drain material layer 203 are Group IV material(s) or Group III-V alloys, or even Group III-N alloys, various levels of strain may be induced into either or both of source and drain material layer 203 and channel material layer 205. The type of strain (compressive or tensile) may be selected to ultimately improve channel mobility of either a p-type or n-type charge carrier.

Figure 4B:
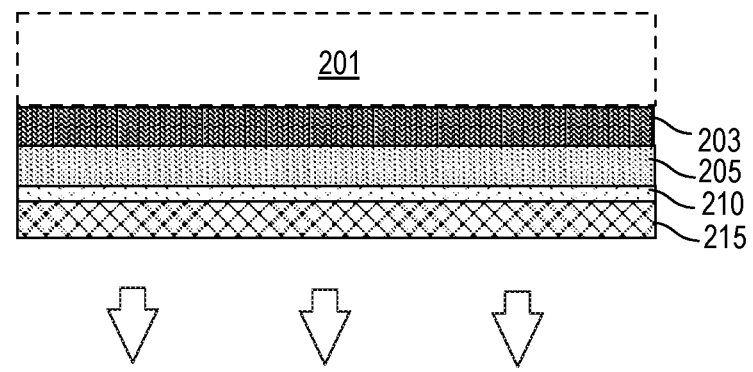
Figure 4B:
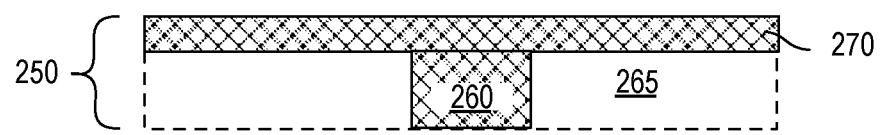

As further shown in FIG. 4A, over channel material layer 205 is a gate stack that in this example includes gate dielectric 210 and work function layer 215. Gate dielectric 210 and work function layer 215 may each have any of the attributes described above. FIG. 4B next illustrates a bonding of the work function layer 215 to metal layer 270 of host substrate 250. In this example, dedicated bonding layers not depicted to emphasize that in some embodiments, work function layer 215 may also be suitable for forming a metal-metal bond with host substrate 250. Similarly, metal layer 270 may be suitable for directly forming a metal-metal bond with work function metal layer 215. As such, the number of bottom gate electrode material layers in an upper-level transistor may vary.

Figure 4C:
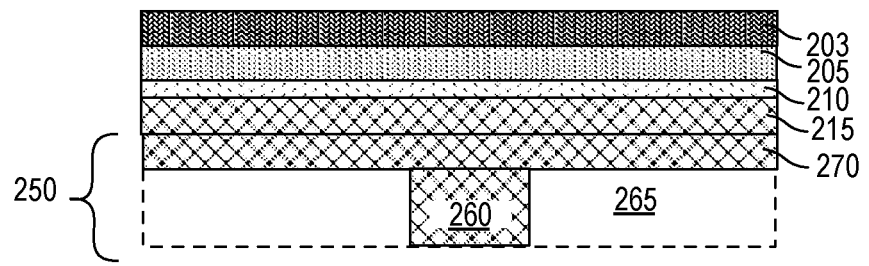
Figure 4D:
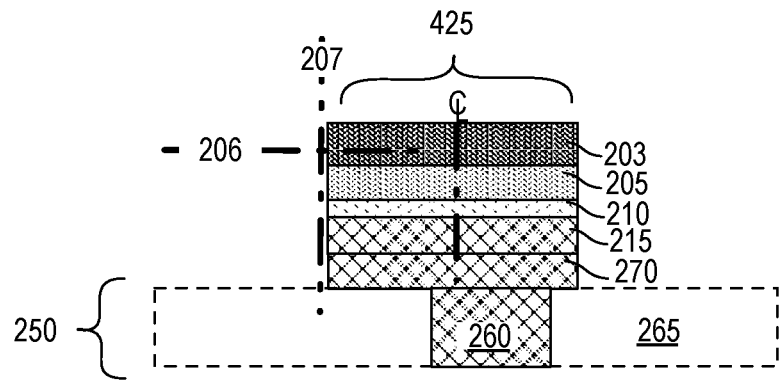
Figure 4E:
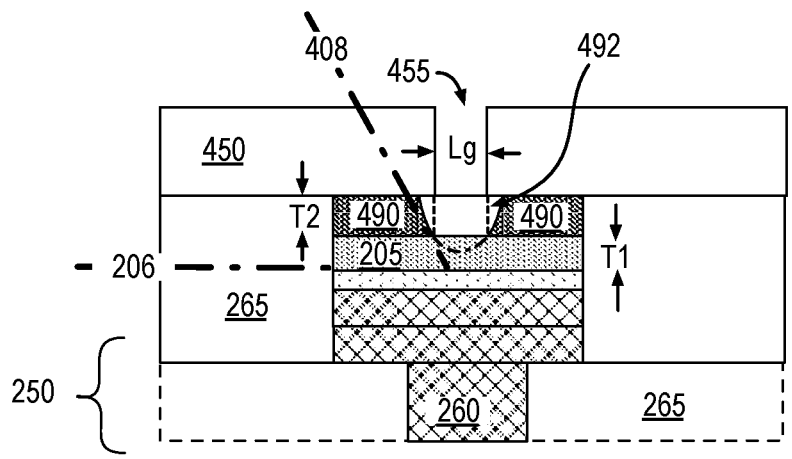

In FIG. 4C, the donor material stack including source and drain material layer 203 has been transferred from the donor substrate. Any of the layer transfer techniques described above may be similarly practiced to transfer the donor material stack in a manner that leaves a top surface of source and drain material layer 203 exposed over the gate stack.

Following layer transfer, the donor material stack may be patterned to define an active transistor structure. For example, as further shown in FIG. 4D, one or more masked etch processes may be performed to pattern a perimeter sidewall of each of source and drain material layer 203, channel material layer 205, gate dielectric material layer 210, workfunction layer 215, and metal layer 270. As shown, active transistor structure 425 again has a substantially vertical structure sidewall 207 with the centerline of each material layer being in substantial alignment.

With source and drain material layer 203 having been fabricated on the donor substrate, a masked patterning of source and drain material layer 203 is performed (instead of a masked source and drain material growth). In the example further shown in FIG. 4E, a mask material 450 has an opening in alignment over a portion of source and drain material layer 203. A recess 455 is etched through source and drain material layer to define source and drain material 490. As shown in dashed line, recess 455 may have a sidewall slope profile 492 that varies from a substantially vertical sidewall profile to a tapered sidewall profile having some slope 408 that is non-orthogonal to channel material plane 206. Variation in sidewall slope profile 492 is a function of whether an anisotropic or isotropic etchant is employed, and whether that etchant offers more or less selectively for source and drain material layer 203 over channel material layer 205. Etch selectivity is in turn a function of differences in the composition between channel material layer 205, and source and drain material layer 203. Various composition-dependent etchants are known, some of which are dopant dependent, and any suitable dry or wet etch process may be practiced to form recess 455.

Where etch selectivity is low, a tapered profile stopping somewhere within channel material layer 205 may resulting in recess 455 having a "U" profile. As it is important to completely etch through source and drain material layer thickness T2, over etch is needed, which may reduce the channel thickness to be less than T1 within recess 455 if selectively is low. Such a reduction in channel thickness is acceptable and can even help to ensure a transistor will operate as an ultra thin body. For such embodiments, source and drain material 490 remains separated (in z-axis) from channel material layer 205 by the full channel thickness T1. For other embodiments where etch selectivity is higher, a more vertical sidewall provide 492 can result in recess 455 having a substantially square, or step function profile with channel thickness T1 being maintained below recess 455.

Figure 4F:
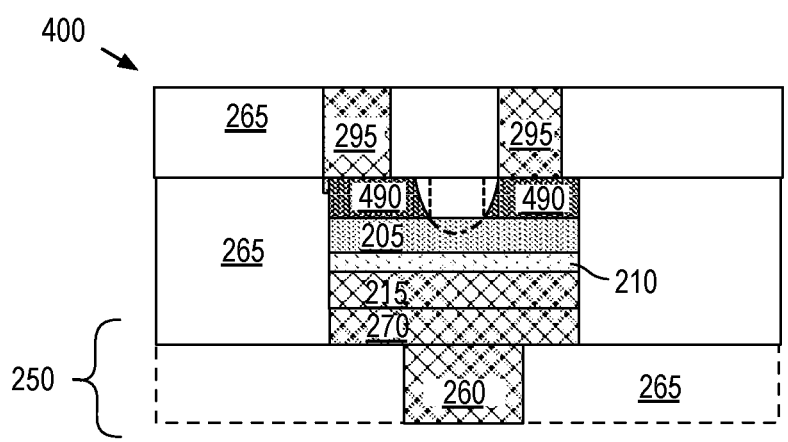

Upper-level transistor structure 400 is substantially complete, as illustrated in FIG. 4F, following formation of source and drain contact metal 295, for example according to any of the techniques described above. Although not depicted, transistor structure 400 is amenable to implementing back-gate and top-gate (double-gate) architectures, for example substantially as described elsewhere herein.

As noted above, transistor structure 200 (FIG. 2I) and transistor structure 400 (FIG. 4F) may each be either a PMOS or NMOS device. As such, a plurality of transistor structures 200 may be fabricated to be either all PMOS or all NMOS devices. Similarly, a plurality of transistor structures 400 may be fabricated to be either all PMOS or all NMOS devices. In some 3DICs where upper-level transistors are to function as access transistors of memory cells further including a bit storage device, such as a capacitor, all of the upper-level transistors may be NMOS devices, for example.

Figure 5A:
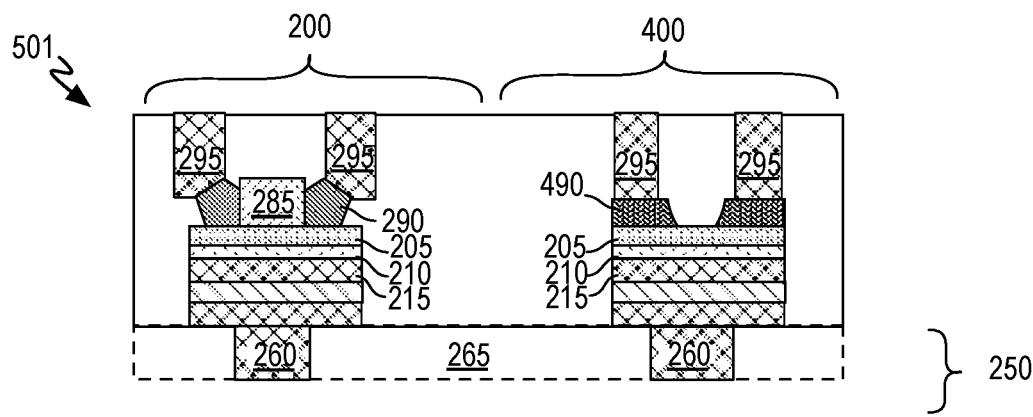
FIG. 5A is a cross-sectional view of two upper-level bottom-gate transistor structures including a monocrystalline channel material, in accordance with some embodiments.

In other embodiments, both PMOS and NMOS devices are fabricated, for example to facilitate upper-level CMOS circuitry. For some such embodiments, PMOS and NMOS devices both have transistor structure 200. For some other embodiments, PMOS and NMOS devices both have transistor structure 400. In still other implementations, one of the PMOS and NMOS devices has transistor structure 200 while the other of the PMOS and NMOS devices has transistor structure 400. FIG. 5A further illustrates an exemplary upper-level CMOS structure 501 that includes upper-level transistor structure 200 adjacent to upper-level transistor structure 400. In one example, transistor structure 200 is a PMOS device while transistor structure 400 is an NMOS device. Advantageously, one of the device types (e.g., NMOS) has a source and drain material that is preformed over a donor substrate and therefore potentially at high temperature while the other device type (e.g., PMOS) employs a low-temperature source drain growth. This arrangement simplifies a CMOS implementation, and the NMOS device is not constrained to low temperature n-type source and drain formation.

Fabrication of CMOS structure 501 may proceed according to another embodiment of methods 101 (FIG. 1). For example, a donor material stack including an n-type source and drain material layer may be transferred to a host substrate. The n-type source and drain material may then be patterned into source and drain material 490, for example substantially as described elsewhere herein. During this patterning process, or during a supplemental patterning process, the n-type source and drain material layer may be completely removed from channel material layer 205 within transistor structure 200. A mask material may then be applied over transistor structure 400. Such a mask may be patterned, for example, as part of the patterning of top channel mask 285, substantially as described elsewhere herein. With top channel mask 285 in place, a low-temperature epitaxial growth may be performed to form p-type source and drain material 290. Contact metal 295 may then be formed to the various source and drain materials, for example according to any of the techniques described elsewhere herein.

As further shown in FIG. 5A, both transistor structures 200 and 400 include the same channel material layer 205, gate dielectric 210, and gate stack materials (e.g., work function layer 215). As such, work function layer 215 is to provide a reasonable threshold voltage for both NMOS and PMOS. In some embodiments work function layer 215 is a mid-gap material (e.g., TiN). Such a mid-gap material may be advantageous for CMOS implementations where channel material layer 205 is sufficiently thin, and transistor structures 200 and 400 are operable as ultra thin body devices.

Figure 5B:
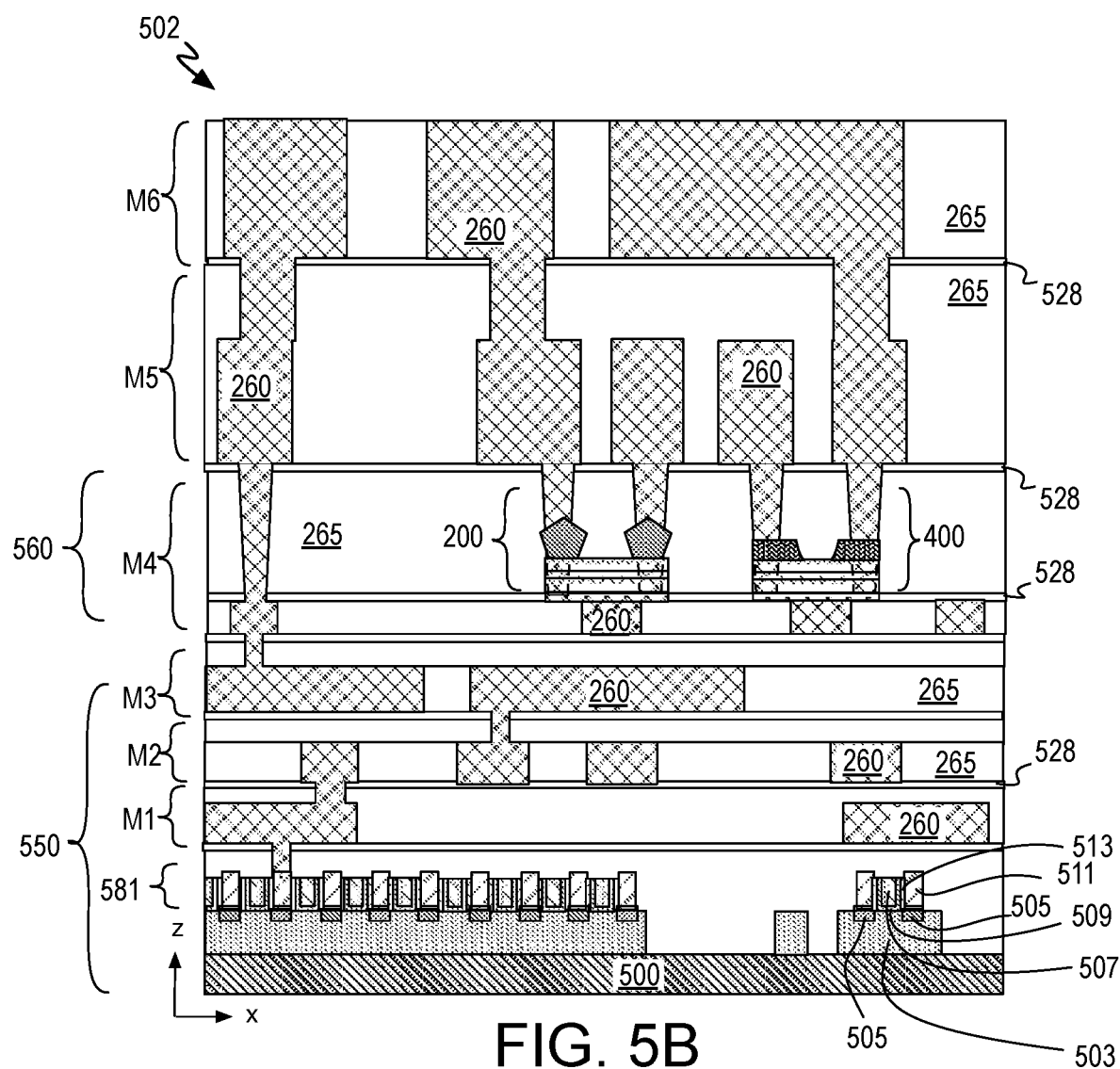
FIG. 5B illustrates a cross-sectional view of a monolithic 3DIC structure including upper-level transistors over lower-level integrated circuitry, in accordance with some embodiments.

FIG. 5B illustrates a cross-sectional side view of a monolithic 3DIC structure 502, in accordance with some embodiments. Structure 502 illustrates a portion of a monolithic IC that includes FEOL device circuitry 550 that is over and/or on a monocrystalline substrate 500. Structure 502 further includes BEOL device circuitry 560 that comprises CMOS structure 501. Alternatively, only one of transistor structures 200 or 400 may be present within BEOL device circuitry.

In the illustrated example, FEOL device circuitry 550 includes a plurality of MOSFETs 581 that employ a monocrystalline semiconductor material 503 for at least a channel region of each transistor. In other embodiments, FEOL device circuitry 550 includes other types of transistors (e.g., bipolar junction transistor, etc.), or other active devices employing one or more semiconductor materials (e.g., diodes, lasers, etc.).

FETs 581 include a gate terminal 507 separated from semiconductor material 503 by a gate dielectric 509. A channel region of semiconductor material 503 separates source and drains 505. Contact metal 511 is in contact with source and drains 505, and is separated from gate terminal 507 by an intervening dielectric 513. Any materials known to be suitable for FETs may be present in FEOL FETs 581. FETs 581 may be planar or non-planar devices. In some advantageous embodiments, FETs 581 are finFETs, but FETs 581 may also have any other multi-gate structure. FETs 581 may include one or more semiconductor materials. As one example, semiconductor material 503 is a surface layer of monocrystalline substrate 501. Substrate 501 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry 550 may further include one or more levels of interconnect metallization features 260 electrically insulated by dielectric materials 265 and 528. In the exemplary embodiment illustrated, FEOL device circuitry 550 includes metal-one (M1), metal-two (M2) and metal-three (M3) interconnect metallization levels. Interconnect metallization features 260 may be of any metal(s) suitable for FEOL and/or BEOL IC interconnection, such as any of those listed above. Dielectric material 528 may have a different composition that dielectric material 265, and may be of a composition that has a higher dielectric constant than that of dielectric material 265. In some examples where dielectric material 265 is predominantly silicon and oxygen (i.e., $SiO_x$), dielectric material 528 is predominantly silicon and nitrogen (i.e., $SiN_x$). In other examples, where dielectric material 265 is a low-k dielectric (e.g., carbon-doped silicon oxide, SiOC:H), dielectric material 528 is predominantly a higher-k dielectric (e.g., $SiO_2$).

BEOL device circuitry 560 is located over the FEOL device circuitry 550, with dielectric material 265 between circuitry 550 and circuitry 560. In the illustrated examples, BEOL device circuitry 560 is CMOS circuitry that includes both an NMOS transistor structure 400 and a PMOS transistor structure 200. Because transistor structures 200 and 400 are over the FEOL device circuitry 550, they are upper-level transistors while transistors 581 are lower-level transistors.

As further illustrated in FIG. 5, 3DIC structure 502 may further comprise any number of metallization levels, such as a metallization level (e.g., M5 and M6) above the metallization level (e.g., M4) at which upper-level transistor structures 200 and 400 reside. Any number of interconnect metallization levels may couple BEOL circuitry 560 to the underlying FEOL device circuitry 550. In the example shown in FIG. 5, metallization levels of BEOL circuitry (e.g., M6) may be routed down through any number of metallization levels (e.g., M5-M3) to be in electrical communication with one or more FEOL transistors 181.

In further embodiments, there may be multiple levels of BEOL device circuitry 560 located over the FEOL device circuitry 550, with dielectric material between each BEOL device circuitry level. A level of BEOL device circuitry 560 may include a plurality of PMOS and/or NMOS transistor structures 200 and/or 400. In other embodiments, a 3DIC structure may include multiple levels of the BEOL device circuitry 560 without any monocrystalline FEOL transistors. For such embodiments, the multiple levels of NMOS and/or PMOS transistor structures 200 and/or 400 may be over any substrate (e.g., polymer, glass, etc.).

Figure 6:
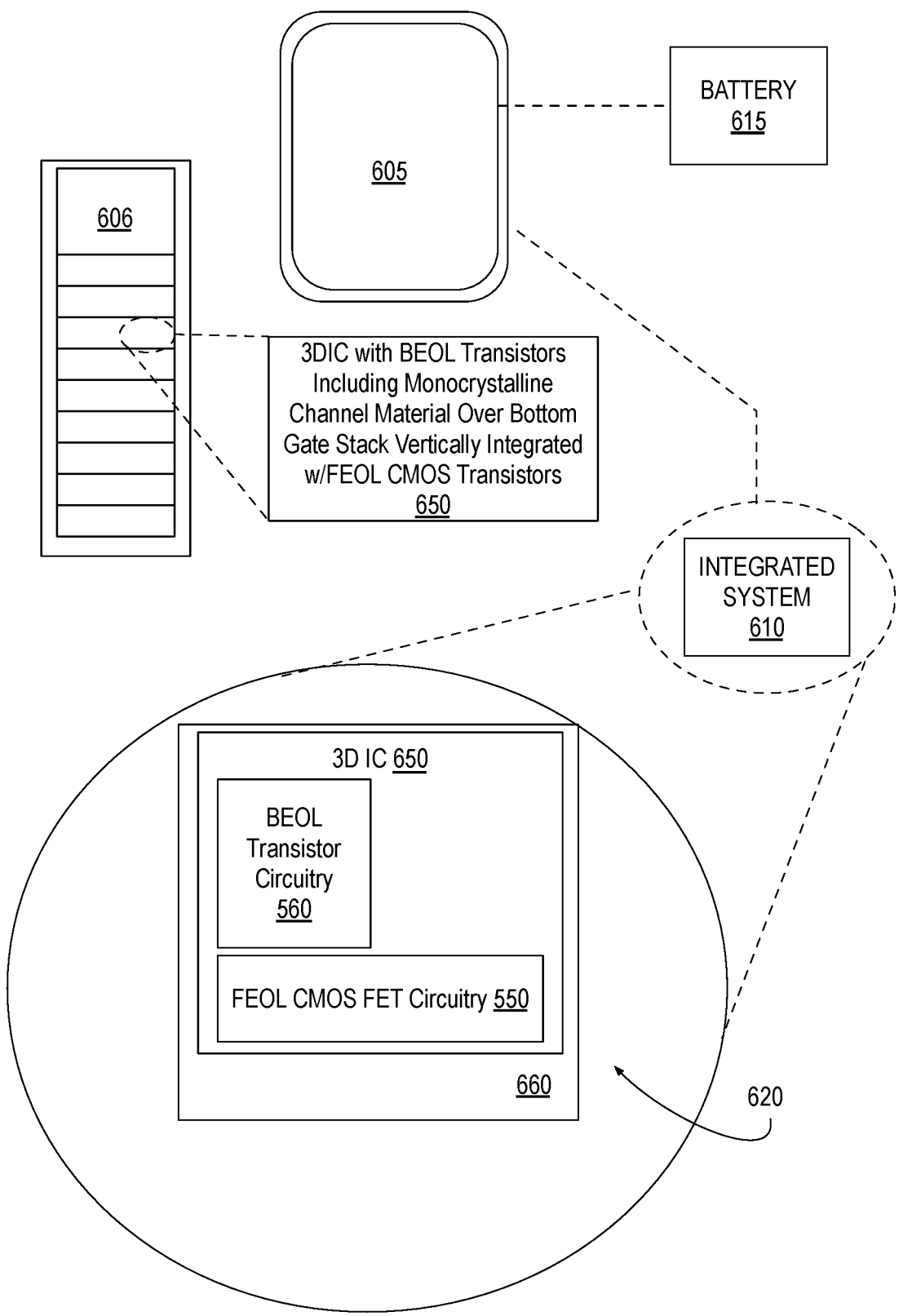
FIG. 6 illustrates a system employing a 3DIC, in accordance with some embodiments.

FIG. 6 illustrates a system in which a mobile computing platform 605 and/or a data server machine 606 employs an IC including at least one back-end semiconductor device with a monocrystalline channel material over a gate stack. Such a back-end semiconductor device may be over a front-end semiconductor device, in accordance with some embodiments. The server machine 606 may be any commercial server, for example including any number of high-performance computing platforms disposed within a rack and networked together for electronic data processing, which in the exemplary embodiment includes a packaged monolithic 3DIC 650. The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), a chip-level integrated system 610, and a battery 615.

Whether disposed within the integrated system 610 illustrated in the expanded view 620, or as a stand-alone packaged chip within the server machine 606, monolithic 3DIC 650 may include memory circuitry (e.g., RAM), or a logic circuitry (e.g., a microprocessor, a multi-core microprocessor, graphics processor, or the like) at least one of which further includes a transistor with a monocrystalline channel material coupled to an underlying bottom gate electrode, for example, as described elsewhere herein. 3DIC 650 may further include silicon CMOS front-end circuitry 550 and BEOL transistor circuitry 560, for example having any of the attributes described elsewhere herein. The 3DIC 650 may be further coupled to a board, a substrate, or an interposer 660.

3DIC 650 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 7:
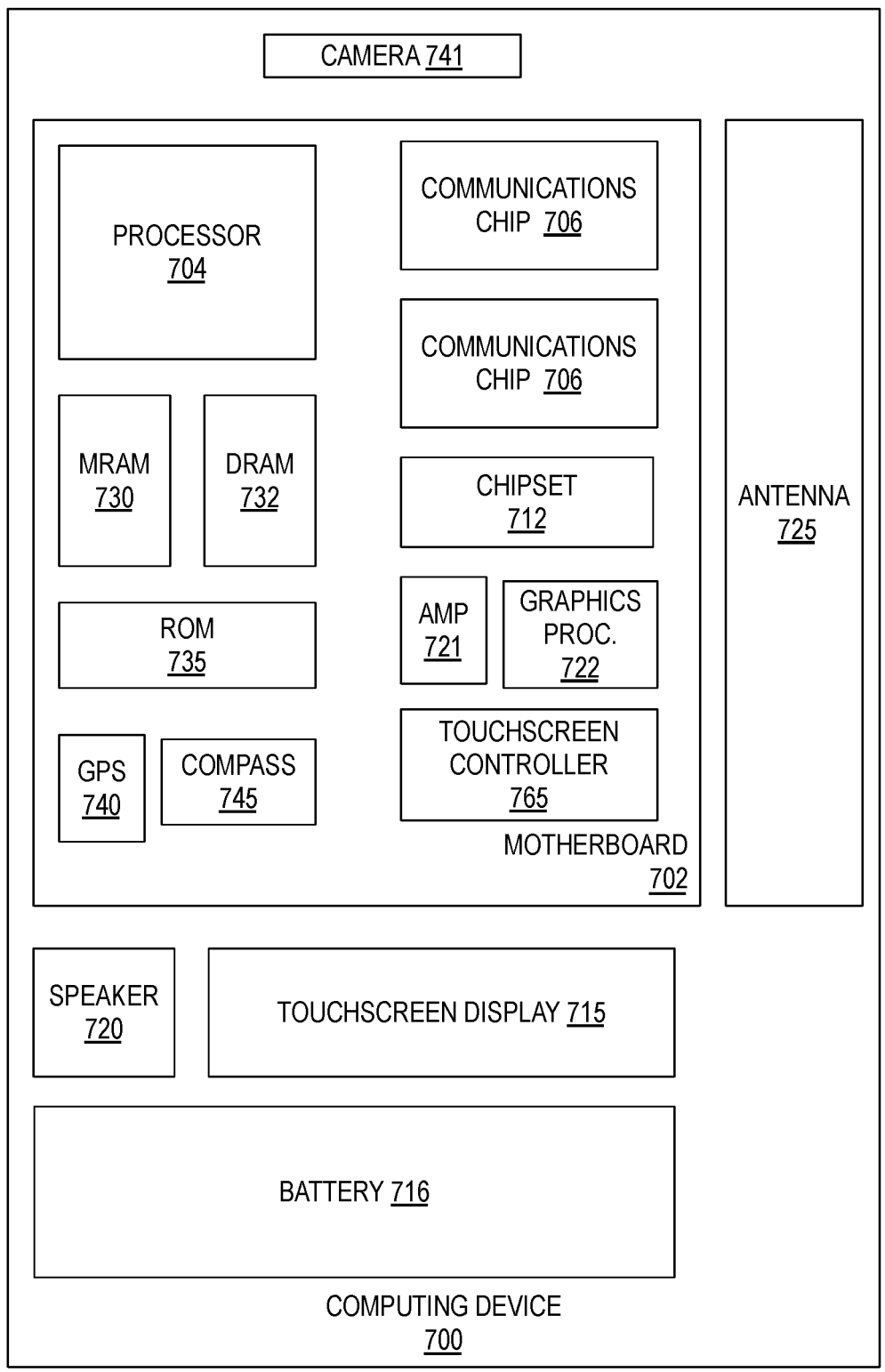
FIG. 7 is a functional block diagram illustrating an electronic computing device, in accordance with some embodiments.

FIG. 7 is a functional block diagram of an electronic computing device 700, in accordance with some embodiments. Device 700 further includes a motherboard 702 hosting a number of components, such as, but not limited to, a processor 704 (e.g., an applications processor). Processor 704 may be physically and/or electrically coupled to motherboard 702. In some examples, processor 704 is part of a monolithic 3DIC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth, or the like.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including, but not limited to, those described elsewhere herein. As discussed, computing device 700 may include a plurality of communication chips 706.

For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the present disclosure is not limited to the embodiments so described, but can be practiced with modification and alteration without departing from the scope of the appended claims. For example the above embodiments may include specific combinations of features as further provided below.

In first examples, an integrated circuit (IC) structure comprises one or more levels of metallization over one or more first transistor structures, and a second transistor structure over the one or more levels of metallization. The second transistor structure comprises a gate electrode in contact with an interconnect feature of one of the levels of metallization, wherein the gate electrode comprises a work function metal layer in contact with the gate dielectric. The second transistor structure further comprises a channel material layer over the gate electrode, with a gate dielectric therebetween. The channel material layer comprises a monocrystalline semiconductor. A source material and a drain material in are contact with separate portions of the channel material layer. The source material and the drain material comprise a monocrystalline semiconductor material having a same crystal orientation as the channel material layer.

In second examples, for any of the first examples, the gate dielectric comprises a compound having a bulk relative permittivity over 7.

In third examples, for any of the second examples the gate dielectric comprises a metal and oxygen.

In fourth examples, for any of the first through third examples, a first sidewall defining a perimeter of the channel material layer is in alignment with a second sidewall defining a perimeter of the gate dielectric, and is in alignment with a third sidewall defining a perimeter of the gate electrode.

In fifth examples, for any of the fourth examples the gate electrode further comprises two or more metal layers between the work function metal layer and the interconnect feature.

In sixth examples, for any of the fifth examples the two or more metal layers comprise a metal layer further comprising at least one of Ti, Ni, W, Ru, Cu, Al, Ta, or N.

In seventh examples, for any of the sixth examples the two or more metal layers comprise a metal layer further comprising silicon and at least one of Ni, Ti, W, or Pt.

In eighth examples, for any of the fourth examples the source material comprises a first crystal having one or more first crystal facets, and the drain material comprises a second crystal having one or more second crystal facets, and wherein the first and second crystal facets are non-orthogonal to a plane of the channel material layer.

In ninth examples, for any of the fourth examples a fourth sidewall of the source material is in alignment with a first portion of the first sidewall, and wherein a fifth sidewall of the drain material is in alignment with a second portion of the first sidewall.

In tenth examples, for any of the ninth examples the source material is laterally separated from the drain material by a length of the channel material layer having a first thickness over the gate dielectric, and wherein the source material is separated from the gate dielectric by at least the first thickness of the channel material layer.

In eleventh examples, for any of the tenth examples the source material and the drain material are separated from the gate dielectric by a second thickness of the channel material layer, greater than the first thickness.

In twelfth examples, for any of the ninth through eleventh examples the fourth sidewall is distal from the drain material and is substantially orthogonal to a plane of the channel material, and wherein a sidewall of the source material proximal to the drain material has a slope that is non-orthogonal to the plane of the channel material.

In thirteenth examples, for any of the twelfth examples the fifth sidewall is distal from the source material and is substantially orthogonal to the plane of the channel material, and wherein a sidewall of the drain material proximal to the source material has the slope that is non-orthogonal to the plane of the channel material.

In fourteenth examples, for any of the first through thirteenth examples the channel material layer comprises a Group IV, or a Group III-V material.

In fifteenth examples, for any of the first through thirteenth examples the channel material layer comprises predominantly silicon, and wherein the source material and the drain material both comprise silicon and one or more n-type impurities.

In sixteenth examples, an integrated circuit (IC) structure comprises one or more levels of metallization over one or more first transistor structures, and an NMOS transistor structure over the one or more levels of metallization. The NMOS transistor structure comprises a gate electrode stack in contact with an interconnect feature of one of the levels of metallization. The NMOS transistor structure comprises a channel material layer over the gate electrode stack, with a gate dielectric material layer therebetween. The channel material layer comprises monocrystalline silicon. The NMOS transistor structure comprises a source material and a drain material over the channel material layer. The source material and the drain material are two portions of a monocrystalline n-type silicon layer with an intervening recess therebetween, the recess exposing the channel material layer.

In seventeenth examples, for any of the sixteenth examples, the gate dielectric material layer comprises a compound having a bulk permittivity over 7, and the gate electrode stack comprises a work function metal layer in contact with the gate dielectric layer, and further comprises two or more metal layers between the work function metal layer and the interconnect feature.

In eighteenth examples, for any of the seventeenth examples the two or more metal layers comprise a first metal layer directly bonded to a second metal layer.

In nineteenth examples, a method of fabricating a transistor structure comprises receiving a donor substrate upon which there is a gate stack in contact with a channel material layer, the channel material layer comprising a monocrystalline semiconductor, and the gate stack comprising at least a gate dielectric layer and a workfunction metal layer. The method comprises receiving a host substrate comprising one or more levels of metallization interconnecting lower-level transistors. The method comprises transferring the gate stack and the channel material layer from the donor substrate to the host substrate. The method comprises bonding a metal layer of the gate stack to a second metal layer over the one or more levels of metallization. The method comprises forming a source material and a drain material coupled to separate portions of the channel material; and etching through at least the channel material layer, the gate stack and the second metal layer to define a perimeter of the transistor structure.

In twentieth examples, for any of the nineteenth examples forming the source material and the drain material further comprises transferring a source and drain material layer along with the gate stack and the channel material layer. The source and drain material layer is separated from the gate stack by the channel material layer. Forming the source material and the drain material further etching through a portion of the source and drain material layer that is over the channel material layer.

In twenty-first examples, for any of the twentieth examples the etching through the portion of the source and drain material layer comprises an etch process that is selective to the channel material layer.

In twenty-second examples, for any of nineteenth through twenty-first example etching through at least the channel material layer and the gate stack further comprises etching through the source and drain material layer.

In twenty-third examples, for any of the nineteenth through twenty-second examples forming the source material and the drain material further comprises forming a mask pattern over a portion of the channel material layer after the bonding, and epitaxially growing the source material and the drain material from separate portions of the channel material layer separated by the mask pattern at a temperature below 450° C.

In twenty-fourth examples, for any of the nineteenth through twenty-third examples the gate stack comprises a bonding metal layer, the work function metal layer is between the bonding metal layer and the gate dielectric material layer, and bonding the metal layer of the gate stack to the second metal layer further comprises contacting the bonding metal layer to the second metal layer.

In twenty-fifth examples, for any of the twenty-fourth examples etching through at least the channel material layer, the gate stack and the second metal layer further comprises etching through a source and drain material layer, the channel material layer, the gate dielectric layer, the work function metal layer, the bonding metal layer, and the second metal layer.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the disclosure should, therefore, be determined with reference to the appended claims, along with the full scope of equivalents to which such claims are entitled.

What is claimed is:

1. An integrated circuit (IC) structure, comprising:
    one or more levels of metallization over one or more first transistor structures; and
    a second transistor structure over the one or more levels of metallization, the second transistor structure comprising:
        a gate electrode in contact with an interconnect feature of one of the one or more levels of metallization, wherein the gate electrode comprises a work function metal layer further in contact with a gate dielectric;
        a channel material layer over the gate electrode, with the gate dielectric therebetween, wherein the channel material layer comprises a monocrystalline semiconductor; and
        a source material and a drain material in contact with separate portions of the channel material layer, wherein the source material and the drain material comprise a monocrystalline semiconductor material having a same crystal orientation as the channel material layer.

2. The IC structure of claim 1, wherein the gate dielectric comprises a compound having a bulk relative permittivity over 7.

3. The IC structure of claim 2, wherein the gate dielectric comprises a metal and oxygen.

4. The IC structure of claim 1, wherein a first sidewall defining a perimeter of the channel material layer is aligned with a second sidewall defining a perimeter of the gate dielectric, and is aligned with a third sidewall defining a perimeter of the gate electrode.

5. The IC structure of claim 4, wherein a fourth sidewall of the source material is in alignment with a first portion of the first sidewall, and wherein a fifth sidewall of the drain material is in alignment with a second portion of the first sidewall.

6. The IC structure of claim 5, wherein a length of the channel material layer having a first thickness over the gate dielectric is between the source material and the drain material, and wherein at least the first thickness of the channel material layer is between the source material and the gate dielectric.

7. The IC structure of claim 6, wherein a second thickness of the channel material layer, greater than the first thickness, is between the source material and the drain material.

8. The IC structure of claim 6, wherein the fourth sidewall is distal from the drain material and is substantially orthogonal to a plane of the channel material, and wherein a sidewall of the source material proximal to the drain material has a slope that is non-orthogonal to the plane of the channel material.

9. The IC structure of claim 8, wherein the fifth sidewall is distal from the source material and is substantially orthogonal to the plane of the channel material, and wherein a sidewall of the drain material proximal to the source material has the slope that is non-orthogonal to the plane of the channel material.

10. The IC structure of claim 1, wherein the gate electrode further comprises two or more metal layers between the work function metal layer and the interconnect feature.

11. The IC structure of claim 10, wherein the two or more metal layers comprise a metal layer further comprising at least one of Ti, Ni, W, Ru, Cu, Al, Ta, or N.

12. The IC structure of claim 11, wherein the two or more metal layers comprise a metal layer further comprising silicon and at least one of Ni, Ti, W, or Pt.

13. The IC structure of claim 1, wherein the source material comprises a first crystal having one or more first crystal facets, and the drain material comprises a second crystal having one or more second crystal facets, and wherein the first and second crystal facets are non-orthogonal to a plane of the channel material layer.

14. The IC structure of claim 1, wherein the channel material layer comprises a Group IV, or a Group III-V material.

15. The IC structure of claim 1, wherein the channel material layer comprises predominantly silicon, and wherein the source material and the drain material both comprise silicon and one or more n-type impurities.

16. An integrated circuit (IC) structure, comprising:
one or more levels of metallization over one or more first transistor structures; and
an NMOS transistor structure over the levels of metallization, the NMOS transistor structure comprising:
a gate electrode stack in contact with an interconnect feature of one of the one or more levels of metallization;
a channel material layer over the gate electrode stack, with a gate dielectric material layer therebetween, wherein the channel material layer comprises monocrystalline silicon;
a source material and a drain material over the channel material layer, wherein the source material and the drain material are two portions of a monocrystalline n-type silicon layer with an intervening recess therebetween, the recess exposing the channel material layer.

17. The IC structure of claim 16, wherein:
the gate dielectric material layer comprises a compound having a bulk permittivity over 7; and
the gate electrode stack comprises a work function metal layer in contact with the gate dielectric layer, and further comprises two or more metal layers between the work function metal layer and the interconnect feature.

18. The IC structure of claim 17, wherein the two or more metal layers comprise a first metal layer directly bonded to a second metal layer.

19. An integrated circuit (IC) structure, comprising:
a level of metallization over a first transistor structure; and
a second transistor structure over the level of metallization, the second transistor structure comprising:
a gate electrode in contact with an interconnect feature of the level of metallization, wherein the gate electrode comprises a work function metal layer in contact with a gate insulator comprising a metal and oxygen;
a channel material layer over the gate electrode, with the gate insulator therebetween, wherein the channel material layer comprises a monocrystalline semiconductor; and
a source material and a drain material in contact with separate portions of the channel material layer, wherein the source material and the drain material comprise a monocrystalline semiconductor material having a same crystal orientation as the channel material layer.

20. The IC structure of claim 19, wherein the gate electrode further comprises a second metal layer between the work function metal layer and the interconnect feature, the second metal layer having a different composition than the work function metal layer.

21. The IC structure of claim 20, wherein:
the work function metal layer, the second metal layer, and the channel material layer share a centerline within at least a first dimension; and
the second transistor structure extends laterally beyond opposite edges of the interconnect feature within at least a first dimension.

* * * * *